United States Patent
Smith et al.

(10) Patent No.: US 11,608,174 B2
(45) Date of Patent: Mar. 21, 2023

(54) POWER DISTRIBUTION PANEL

(71) Applicant: GE Aviation Systems Limited, Gloucestershire (GB)

(72) Inventors: Michael James Smith, Chadlington (GB); Alexander James Rainbow, Swindon (GB)

(73) Assignee: GE Aviation Systems Limited, Cheltenham (GB)

(*) Notice: Subject to any disclaimer, the term of this patent is extended or adjusted under 35 U.S.C. 154(b) by 222 days.

(21) Appl. No.: 16/995,195

(22) Filed: Aug. 17, 2020

(65) Prior Publication Data

US 2022/0048624 A1    Feb. 17, 2022

(51) Int. Cl.
*H05K 7/00* (2006.01)
*H05K 7/14* (2006.01)
*B64D 1/00* (2006.01)
*H05K 5/02* (2006.01)
*H05K 7/08* (2006.01)

(52) U.S. Cl.
CPC ............ *B64D 1/00* (2013.01); *H05K 5/0234* (2013.01); *H05K 7/08* (2013.01); *H05K 7/1452* (2013.01); *B64D 2221/00* (2013.01)

(58) Field of Classification Search
CPC .... B64D 1/00; B64D 2221/00; H05K 5/0234; H05K 7/08; H05K 7/1452; H02B 1/043; H02B 1/015; H02B 1/04; H02B 3/00
See application file for complete search history.

(56) References Cited

U.S. PATENT DOCUMENTS

| | | | |
|---|---|---|---|
| 6,061,249 A * | 5/2000 | Nealis | H05K 7/1452 361/801 |
| 8,017,212 B2 | 9/2011 | Leng | |
| 10,245,804 B2 | 4/2019 | Smith et al. | |
| 10,418,766 B2 * | 9/2019 | Jiang | H01R 25/162 |
| 10,559,399 B2 * | 2/2020 | Velthuis | H01B 7/0225 |
| 10,694,637 B1 * | 6/2020 | Wolf | H01Q 1/002 |
| 10,736,228 B2 * | 8/2020 | Kho | G11B 33/142 |
| 10,840,625 B2 * | 11/2020 | Leivers | H05K 7/1412 |
| 11,009,915 B1 * | 5/2021 | Akiyama | G06F 1/1656 |
| 2003/0174464 A1 * | 9/2003 | Funawatari | G11B 25/043 |
| 2007/0074755 A1 * | 4/2007 | Eberspacher | H01L 31/02013 136/244 |
| 2010/0196656 A1 | 8/2010 | Leng | |
| 2016/0032889 A1 | 2/2016 | Tan et al. | |
| 2016/0325520 A1 | 11/2016 | Berger | |
| 2016/0347024 A1 | 12/2016 | Hornich et al. | |
| 2018/0230940 A1 | 8/2018 | Torjesen et al. | |
| 2019/0348558 A1 * | 11/2019 | Wang | H01L 31/0488 |

(Continued)

FOREIGN PATENT DOCUMENTS

CN    106739245 A    5/2017
DE    102005017312 A1    10/2006

(Continued)

*Primary Examiner* — Rockshana D Chowdhury
(74) *Attorney, Agent, or Firm* — Fitch, Even, Tabin & Flannery LLP

(57) ABSTRACT

A power distribution panel with a backplane, an insulating panel covering the backplane, and at least one electronic component mounted to the insulating panel. A set of feet can be mounted to the insulating panel and configured to absorb stress applied to the insulating panel where the set of feet are located in the same plane as the backplane.

15 Claims, 5 Drawing Sheets

(56) References Cited

U.S. PATENT DOCUMENTS

| | | | | |
|---|---|---|---|---|
| 2020/0012151 | A1* | 1/2020 | Tang | G02F 1/133608 |
| 2020/0194940 | A1* | 6/2020 | Cohen | H01R 13/6471 |
| 2020/0317357 | A1* | 10/2020 | Demont | B60K 1/04 |
| 2021/0204431 | A1* | 7/2021 | Niizuma | G11B 33/08 |
| 2021/0399488 | A1* | 12/2021 | Song | H01R 13/6471 |
| 2022/0005990 | A1* | 1/2022 | Su | H01L 23/48 |
| 2022/0013835 | A1* | 1/2022 | Bradwell | H01M 10/658 |
| 2022/0046807 | A1* | 2/2022 | Guillot | H05K 3/4623 |
| 2022/0046819 | A1* | 2/2022 | Peng | H05K 3/103 |

FOREIGN PATENT DOCUMENTS

| | | | |
|---|---|---|---|
| DE | 102006003732 A1 | 8/2007 | |
| EP | 0048203 A1 | 3/1982 | |

\* cited by examiner

POWER DISTRIBUTION PANEL

TECHNICAL FIELD

The disclosure generally relates to power distribution panel, and more specifically to the structural components forming the power distribution panel.

BACKGROUND

Contemporary aircraft use avionics in order to control the various equipment and operations for flying the aircraft. The avionics can include electrical components carried by a circuit board or connected to circuit breakers. An electrical distribution system for the aircraft includes power distribution panels that can be used to route power from electrical generators to various electrical loads. Such power distribution panels can be relatively large, and can include assemblies charged with critical aspects in performance of the electrical system, often within a demanding environment.

BRIEF DESCRIPTION

Aspects and advantages of the disclosure will be set forth in part in the following description, or may be obvious from the description, or may be learned through practice of the disclosure herein.

In one aspect, the present disclosure relates to a power distribution panel comprising: a backplane comprising at least a portion having a cellular structure defining a plurality of voids at least one electrically insulating panel covering at least some of the plurality of voids; and at least one electrical component mounted to the insulating panel.

In another aspect, the present disclosure relates to a power distribution panel comprising a backplane comprising at least a portion having a cellular structure defining a plurality of voids at least one electrically insulating panel covering at least some of the plurality of voids; at least one electronic component mounted to the insulating panel; and a set of feet mounted to the insulating panel and configured to absorb shear stress applied to the insulating panel; wherein the at least one foot is located in the same plane as the backplane.

In yet another aspect, the present disclosure relates to an A method of manufacturing a power distribution panel comprising forming a cellular structure with a plurality of voids to define a backplane; covering the cellular structure with at least one insulating panel; and mounting at least one electrical component to the insulating panel.

These and other features, aspects and advantages of the disclosure herein will become better understood with reference to the following description and appended claims. The accompanying drawings, which are incorporated in and constitute a part of this specification, illustrate examples of the disclosure and, together with the description, serve to explain the principles of the disclosure herein.

BRIEF DESCRIPTION OF THE DRAWINGS

A full and enabling disclosure, including the best mode thereof, directed to one of ordinary skill in the art, is set forth in the specification, which makes reference to the appended figures in which.

DETAILED DESCRIPTION

Figure 1:
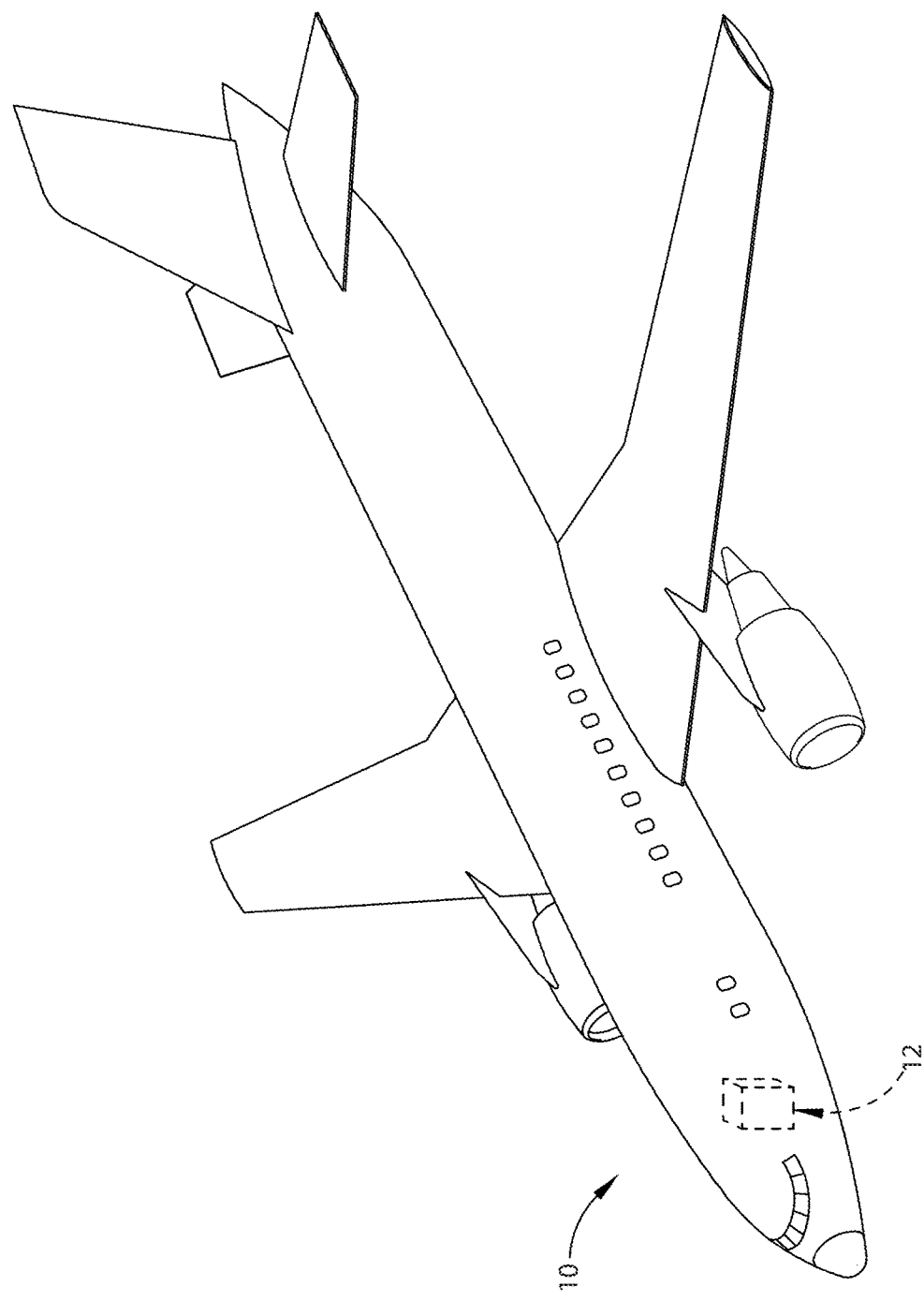
FIG. 1 is a perspective view of an aircraft having a power distribution system.

Aspects of the present disclosure are directed to power distribution panels and the structure thereof. An electrical power distribution system for an aircraft services various loads around the aircraft. Power distribution panels are used to route power from the electrical power source to the electrical loads. Further, on modern aircraft the increased number of services demands an increase in the number of components and circuits which increase complexity and overall weight. Maintaining the structural integrity of a power distribution panel while decreasing the weight becomes essential. Aspects of the disclosure herein describe a beneficial power distribution panel. While the examples described herein are directed to the application of a power distribution panel for an aircraft, the disclosure can be applied to any implementation of a power distribution panel in all aspects of electrical circuitry.

As used herein, the term "upstream" refers to a direction that is opposite the fluid flow direction, and the term "downstream" refers to a direction that is in the same direction as the fluid flow. The term "fore" or "forward" means in front of something and "aft" or "rearward" means behind something. For example, when used in terms of fluid flow, fore/forward can mean upstream and aft/rearward can mean downstream.

Additionally, as used herein, the terms "radial" or "radially" refer to a direction away from a common center. For example, in the overall context of a turbine engine, radial refers to a direction along a ray extending between a center longitudinal axis of the engine and an outer engine circumference. Furthermore, as used herein, the term "set" or a "set" of elements can be any number of elements, including only one.

Additionally, as used herein, a "controller" or "controller module" can include a component configured or adapted to provide instruction, control, operation, or any form of communication for operable components to effect the operation thereof. A controller module can include any known processor, microcontroller, or logic device, including, but not limited to: field programmable gate arrays (FPGA), an application specific integrated circuit (ASIC), a full authority digital engine control (FADEC), a proportional controller (P), a proportional integral controller (PI), a proportional derivative controller (PD), a proportional integral derivative controller (PID controller), a hardware-accelerated logic controller (e.g. for encoding, decoding, transcoding, etc.), the like, or a combination thereof. Non-limiting examples of a controller module can be configured or adapted to run, operate, or otherwise execute program code to effect operational or functional outcomes, including carrying out various methods, functionality, processing tasks, calculations, comparisons, sensing or measuring of values, or the like, to enable or achieve the technical operations or operations described herein. The operation or functional outcomes can be based on one or more inputs, stored data values, sensed or measured values, true or false indications, or the like. While "program code" is described, non-limiting examples of operable or executable instruction sets can include routines, programs, objects, components, data structures, algorithms, etc., that have the technical effect of performing particular tasks or implement particular abstract data types. In another non-limiting example, a controller module can also include a data storage component accessible by the processor, including memory, whether transient, volatile or non-transient, or non-volatile memory. Additional non-limiting examples of the memory can include Random Access Memory (RAM), Read-Only Memory (ROM), flash memory, or one or more different types of portable electronic memory, such as discs, DVDs, CD-ROMs, flash drives, universal serial bus (USB) drives, the like, or any suitable combination of these types of memory. In one example, the program code can be stored within the memory in a machine-readable format accessible by the processor. Additionally, the memory can store various data, data types, sensed or measured data values, inputs, generated or processed data, or the like, accessible by the processor in providing instruction, control, or operation to effect a functional or operable outcome, as described herein.

Additionally, as used herein, elements being "electrically connected," "electrically coupled," or "in signal communication" can include an electric transmission or signal being sent, received, or communicated to or from such connected or coupled elements. Furthermore, such electrical connections or couplings can include a wired or wireless connection, or a combination thereof.

Also, as used herein, while sensors can be described as "sensing" or "measuring" a respective value, sensing or measuring can include determining a value indicative of or related to the respective value, rather than directly sensing or measuring the value itself. The sensed or measured values can further be provided to additional components. For instance, the value can be provided to a controller module or processor as defined above, and the controller module or processor can perform processing on the value to determine a representative value or an electrical characteristic representative of said value.

All directional references (e.g., radial, axial, proximal, distal, upper, lower, upward, downward, left, right, lateral, front, back, top, bottom, above, below, vertical, horizontal, clockwise, counterclockwise, upstream, downstream, forward, aft, etc.) are used only for identification purposes to aid the reader's understanding of the present disclosure, and should not be construed as limiting on an embodiment, particularly as to the position, orientation, or use of aspects of the disclosure described herein. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to one another. The exemplary drawings are for purposes of illustration only and the dimensions, positions, order and relative sizes reflected in the drawings attached hereto can vary.

FIG. 1 schematically illustrates an aircraft 10 with an on-board power distribution system 12 (shown in dashed line), which can include at least one power distribution panel. The power distribution system 12 can house a variety of avionics elements and protect them against contaminants, vibrations, and the like and aids in dissipating the heat generated by the avionics or electrical components. It will be understood that the power distribution system 12 can be located anywhere within the aircraft 10, not just the cockpit area as illustrated. For example, there can be any number of power distribution panels distributing power around the aircraft 10. While illustrated in a commercial airliner, the power distribution system 12 can be used in any type of aircraft, for example, without limitation, fixed-wing, rotating-wing, rocket, commercial aircraft, personal aircraft, and military aircraft. Furthermore, aspects of the disclosure are not limited only to aircraft aspects, and can be included in other mobile and stationary configurations. Non-limiting example mobile configurations can include ground-based, water-based, or additional air-based vehicles. Any implementation has its own space constraints and power requirements. As such, the design of the particular aspects of the power distribution system 12 as described herein can be tailored to suit specific installation requirements of the implementation.

Figure 2:
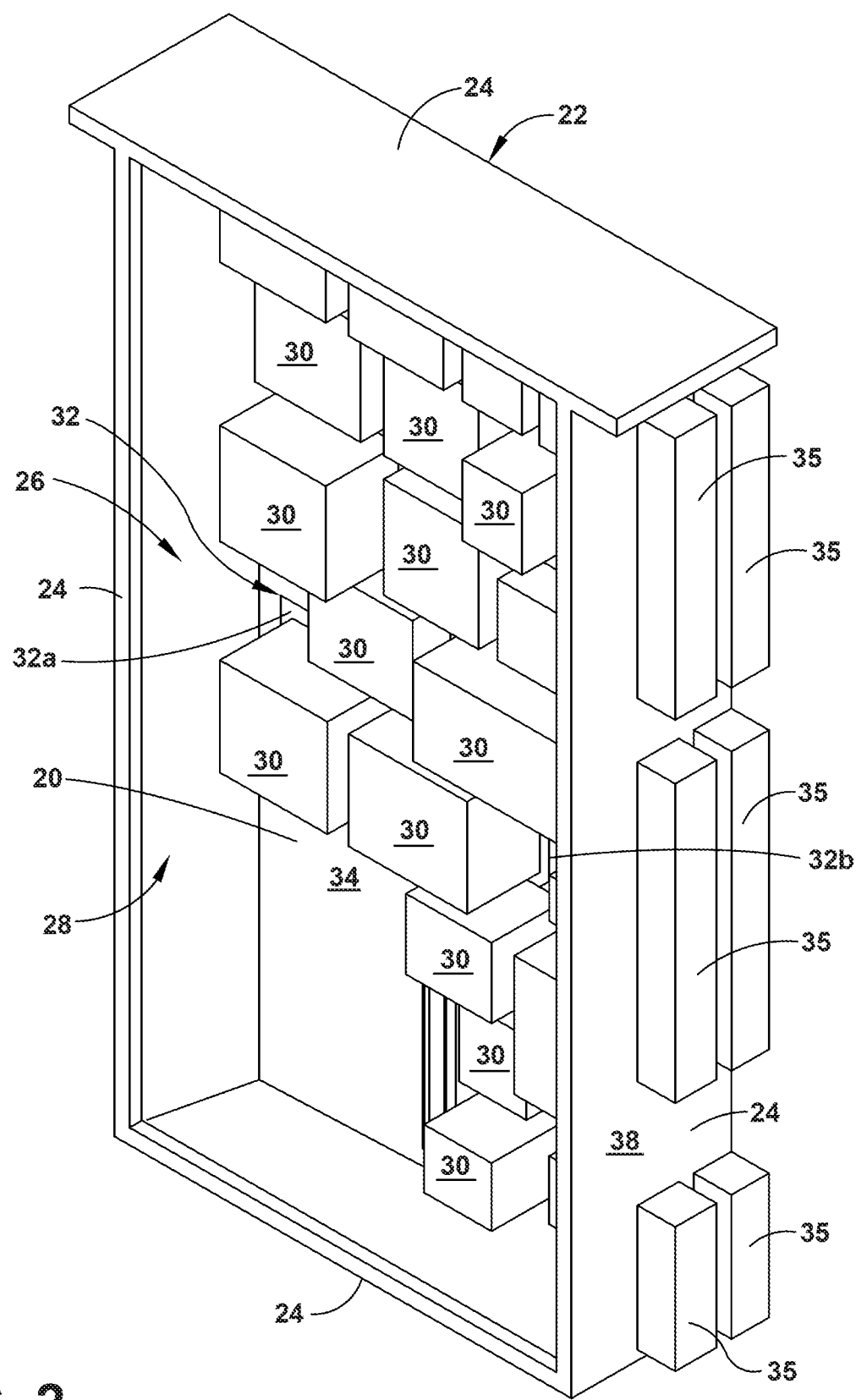
FIG. 2 is a perspective view of a power management cabinet with a power distribution panel for use in the power distribution system of FIG. 1.

Referring now to FIG. 2, an exemplary power distribution panel 20 forming a base for a power management cabinet 22 including a set of walls 24, such as sidewalls, that along with the power distribution panel 20 at least partially define a cabinet interior 26 having an open face 28. It should be appreciated that a cover (not shown), such as a heat shield, or an additional wall can be removably mountable at the open face 28 to enclose the cabinet interior 26. Alternatively, a door can be moveably mounted to the power management cabinet 22 and be positioned in a closed position wherein the cabinet interior 26 is inaccessible and an opened position wherein a user can access the cabinet interior 26.

A set of electrical components 30 can be provided in the cabinet interior 26. The set of electrical components 30 can mount to the power distribution panel 20. More specifically, by way of non-limiting example, to at least one printed circuit board (PCB) 32 mounted to the power distribution panel 20. It is contemplated that the at least one PCB 32 is only one PCB 32 defining an entire front surface 34 of the power distribution panel 20, or that there are multiple PCBs 32a, 32b mounted as illustrated. A set of exterior connectors 36 can be provided on an exterior 38 of the set of walls 24 and communicatively coupled to one or more of the electrical components 30. One exemplary electrical component 30 can be an electronic unit in the form of a power panel controller assembly 40.

Figure 3:
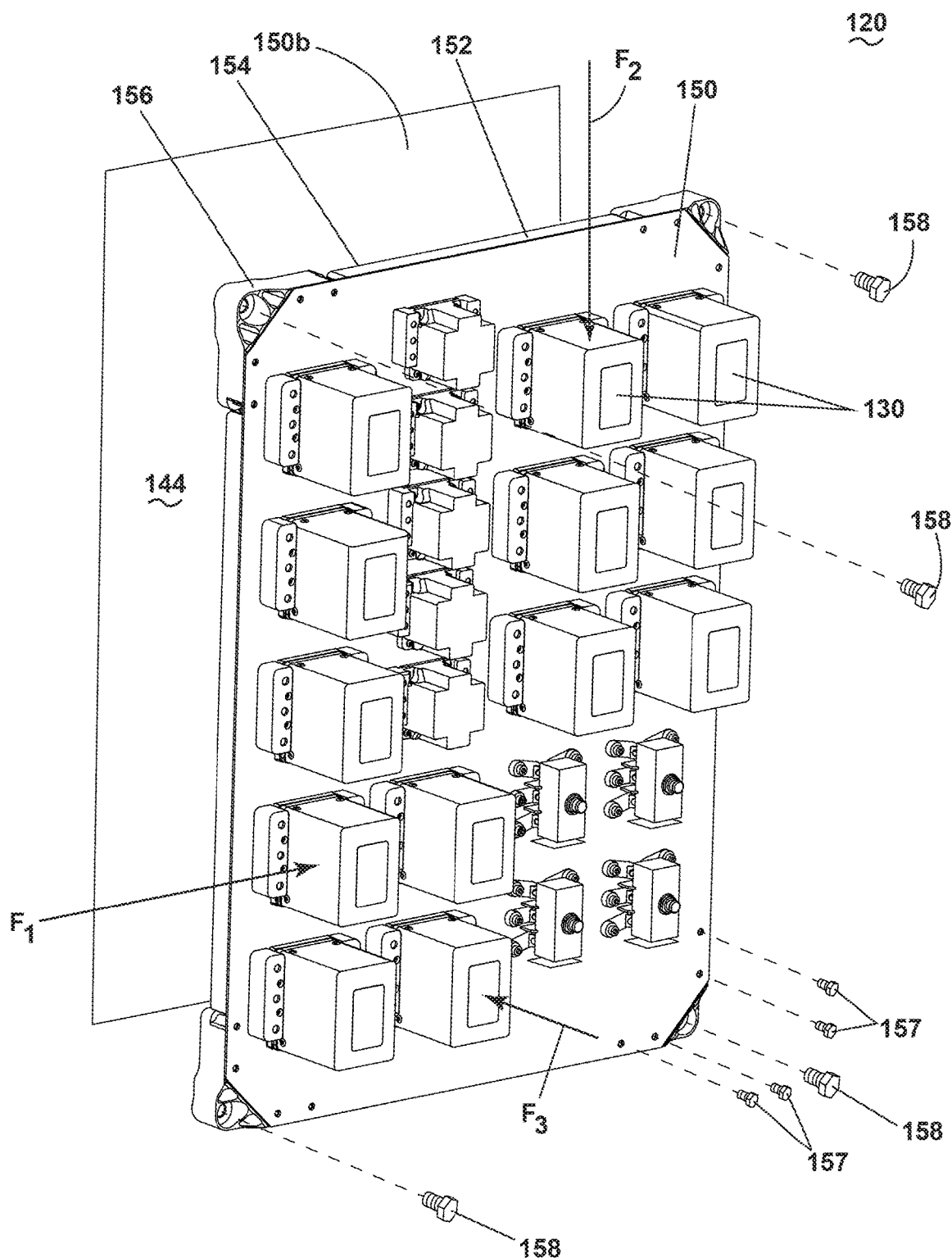
FIG. 3 is a perspective view of a front side of the power distribution panel from FIG. 2 according to another aspect of the disclosure herein.

FIG. 3 illustrates a power distribution panel 120 according to an aspect of the disclosure herein. The power distribution panel 120 is similar to the power distribution panel 20 therefore, like parts will be identified with like numbers increased by 100, with it being understood that the description of the like parts of the power distribution panel 20 applies to the power distribution panel 120 unless otherwise noted.

The power distribution panel 120 includes various mounted electrical components 130, by way of non-limiting example contactors, circuit breakers, relays, solid state switches (SSPCs) or the like. The power distribution panel 120 can be any shape though it is illustrated as rectangular, having four corners 142, and configured to be mounted to a wall space 144 within the aircraft 10. Therefore the power distribution panel 120 can be significantly large. At least one insulating panel 150 defines a front surface 134 to which the electrical components 130 are mounted. The insulating panel 150 can be both electrically insulating and thermally insulating. It is also contemplated that the insulating panel 150 is a layer of electrically insulating and a layer of thermally insulating material. In one non-limiting example the insulating panel 150 is a melamine material. A backplane 152 defines a back surface 154 of the power distribution panel 120. The at least one insulating panel 150 can be multiple insulating panels including a back panel 150b for covering the back surface 154. A set of feet 156 can be located within the same plane as the backplane 152 such that they are flush with the back surface 154 for mounting to the wall space 142. While in the same plane as the backplane 152, the set of feet 156 are configured to be mounted directly to the insulating panel 150 as illustrated by screws 157, not the backplane 152. Any fastener for mounting the power distribution panel 120 to the wall space 144 is contemplated, by way of non-limiting example bolts 158 are illustrated.

In operation shear loads, illustrated by arrows F1 and F2, applied to the power distribution panel are transferred from the insulating panel 150 directly to the set of feet 156. While perpendicular loads, illustrated by arrow F3, are transferred into the backplane 152. The stiffness provided by the backplane enables absorption of the perpendicular loads and transference of the shear loads.

Figure 4:
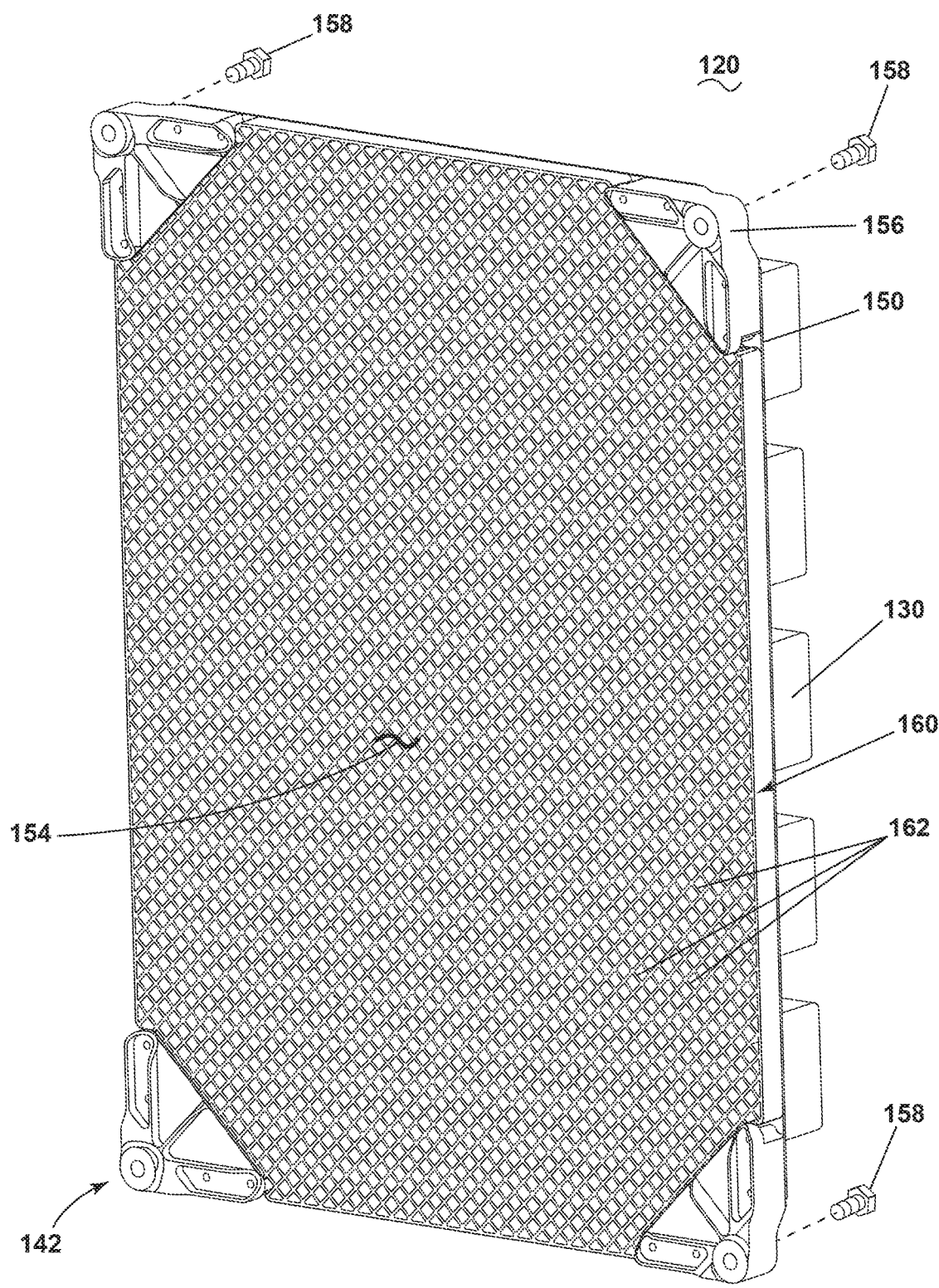
FIG. 4 is a perspective view of a back side of the power distribution panel from FIG. 3.

Turning to FIG. 4, a perspective view of the back surface 154 of the power distribution panel 120 is illustrated. The backplane 152 can be formed from a cellular structure 160 defined by a plurality of voids 162. By way of non-limiting example, the backplane 152 can be formed from aluminum. While illustrated as defining a generally square shape, it should be understood that each of the voids in the plurality of voids 162 can form any shape including but not limited to, polygon, honeycomb or hexagon shapes, where the shape lends itself to tessellating the back surface 154 in an arrangement of shapes closely fitted together in a repeated pattern without gaps or overlapping. The cellular structure 160 as defined herein simply refers to tessellating the back surface 154 with any shape to define the plurality of voids as minute, or small, compartments or cavities. The backplane 152 as described herein can therefore manage structural loads within a large power distribution panel 120. The structure of the backplane 152 enables both absorbing of perpendicular loads F3, directly through the solid portions forming the voids 162 perpendicular to the insulating panel 150 and transferring of shear loads F1, F2 through the solid portions forming the voids 162 parallel to the insulating panel 150. It should be understood that the repeated pattern as described herein can be interrupted for mounting, or when components puncture through the insulating panel 150, or in the event busbars are embedded within the thickness of the backplane 152. While interrupting the repeated pattern may become necessary as described, it should be understood that these interruptions should be limited or avoided where possible.

The backplane 152 can be formed to receive the set of feet 156 at each of the four corners 142 such that the set of feet 156 are mounted directly to the insulating panel 150. In this manner, the backplane 152 is held between the wall space 144 and the insulating panel 150 without being directly attached to either. Though not necessary, it is further contemplated that the backplane 152 can be mounted to the insulating panel 150 by adhesion. It is also contemplated that the set of feet 156 are integrally formed with the backplane 152, by way of non-limiting example utilizing additive manufacturing. While multiple structural forms are contemplated, it should be understood that the distribution of the forces within the backplane 152 structure and the set of feet 156 as described herein remains.

Figure 5:
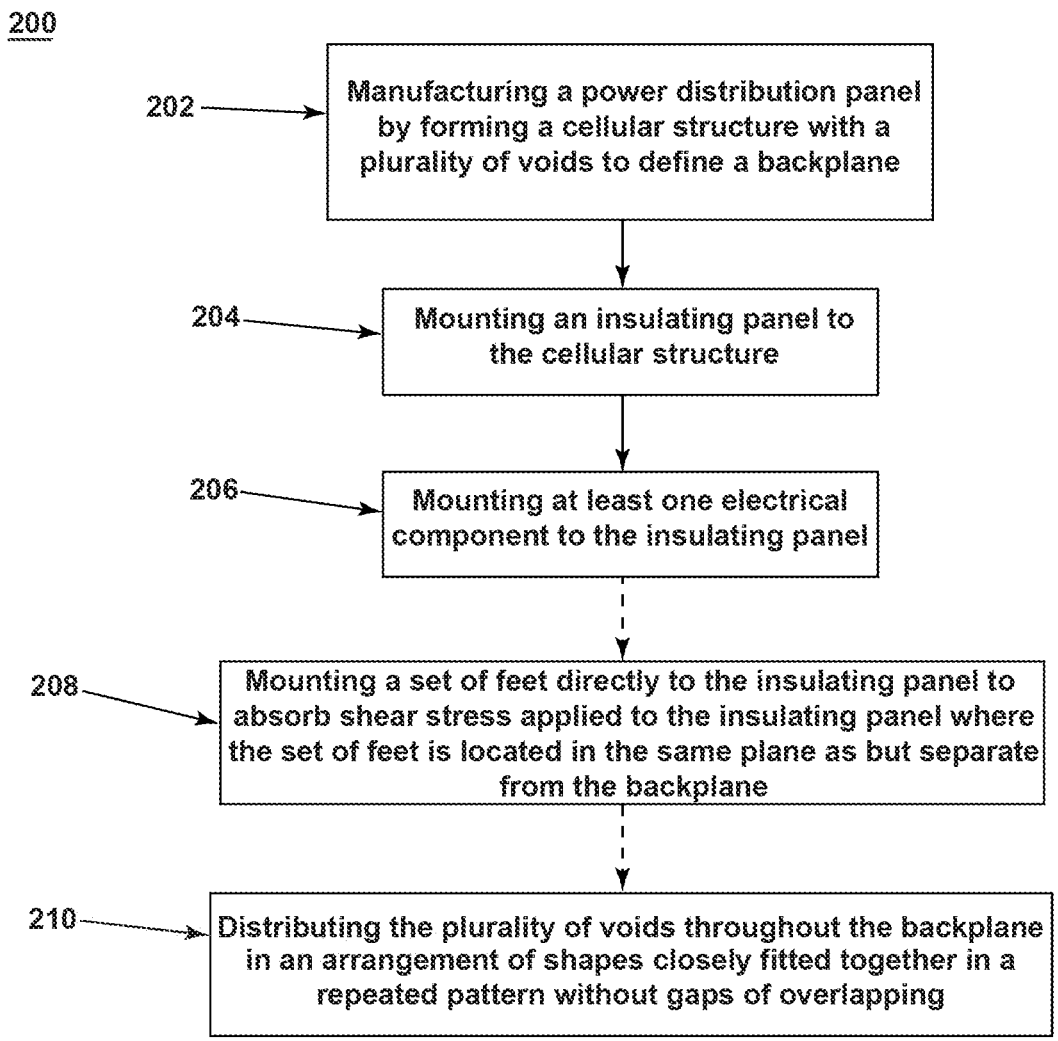
FIG. 5 is a flow chart illustrating a method of manufacturing the power distribution panel of FIG. 1.

Turning to FIG. 5, a flow chart for a method 200 of manufacturing the power distribution panel 120 is illustrated. At 202 forming the cellular structure 160 with the plurality of voids 162 to define the backplane 152. At 204 mounting the insulating panel 150 to the cellular structure 160. At 206 mounting the least one electrical component 130 to the insulating panel 150.

The method 200 can further include at 208 mounting the set of feet 156 directly to the insulating panel 150 to absorb shear stress applied to the insulating panel 150 where the set of feet 156 is located in the same plane as but separate from the backplane 152. The method 200 can further include mounting multiple feet 156 to the insulating panel 150 at corresponding multiple corners 142 of the insulating panel 150. The method 200 can further at include at 210 distributing the plurality of voids 162 throughout the backplane 152 in an arrangement of shapes closely fitted together in a repeated pattern without gaps or overlapping.

It is contemplated that all or part of the power distribution panel 120 as described herein is formed using additive manufacturing. An additive manufacturing (AM) process is where a component is built layer-by-layer by successive deposition of material. AM is an appropriate name to describe the technologies that build 3D objects by adding layer-upon-layer of material, whether the material is plastic or metal. AM technologies can utilize a computer, 3D modeling software (Computer Aided Design or CAD), machine equipment, and layering material. Once a CAD sketch is produced, the AM equipment can read in data from the CAD file and lay down or add successive layers of liquid, powder, sheet material or other material, in a layer-upon-layer fashion to fabricate a 3D object. It should be understood that the term "additive manufacturing" encompasses many technologies including subsets like 3D Printing, Rapid Prototyping (RP), Direct Digital Manufacturing (DDM), layered manufacturing and additive fabrication. Non-limiting examples of additive manufacturing that can be utilized to form an additively-manufactured component include powder bed fusion, vat photopolymerization, binder jetting, material extrusion, directed energy deposition, material jetting, or sheet lamination.

The backplane described herein decreases the weight of the power distribution panel when compared to existing power distribution panels. The decrease in material use decreases cost while still maintaining structural integrity. Further, placement of the backplane with respect to the set of feet provide a load distribution that decreases unnecessary shear stress on the power distribution panel, minimizing the potential for damage to any electrical components.

Bonding a stiff lightweight structure, such as the backplane described herein, directly to the insulating panel provides rigidity and electrical isolation required within a compact and cost sensitive structure. The backplane structure provides rigidity and stiffness for the backplane without increasing weight, this allows for the power distribution panel to handle all the dynamic loading conditions even those created by point masses such as contactors and relays. Decreasing the weight can significantly increase the fuel efficiency and/or the cargo carrying capability.

To the extent not already described, the different features and structures of the various aspects can be used in combination with others as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the disclosure, including the best mode, and also to enable any person skilled in the art to practice aspects of the disclosure herein, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

Further aspects of the disclosure are provided by the subject matter of the following clauses:

A power distribution panel comprising: a backplane comprising at least a portion having a cellular structure defining a plurality of voids at least one electrically insulating panel covering at least some of the plurality of voids; and at least one electrical component mounted to the insulating panel.

The power distribution panel of any preceding clause, further comprising a set of feet mounted to the insulating panel.

The power distribution panel of any preceding clause, wherein the set of feet are configured to absorb shear stress applied to the insulating panel.

The power distribution panel of any preceding clause, wherein at least a portion of the set of feet is located in the same plane as the backplane.

The power distribution panel of any preceding clause, wherein the cellular structure is a honeycomb structure.

The power distribution panel of any preceding clause, wherein the insulating panel is made with melamine.

The power distribution panel of any preceding clause, wherein the cellular structure is made with aluminum.

The power distribution panel of any preceding clause, wherein the plurality of voids are distributed throughout the backplane in an arrangement of shapes closely fitted together in a repeated pattern without gaps or overlapping.

A power distribution panel comprising: a backplane comprising at least a portion having a cellular structure defining a plurality of voids at least one electrically insulating panel covering at least some of the plurality of voids; at least one electronic component mounted to the insulating panel; and a set of feet mounted to the insulating panel and configured to absorb shear stress applied to the insulating panel; wherein the at least one foot is located in the same plane as the backplane.

The power distribution panel of any preceding clause, wherein the plurality of voids is distributed throughout the backplane in an arrangement of shapes closely fitted together in a repeated pattern without gaps or overlapping.

The power distribution panel of any preceding clause, wherein the set of feet is mounted directly to the insulating panel and separate from the backplane.

The power distribution panel of any preceding clause, wherein the insulating panel is made with melamine.

The power distribution panel of any preceding clause, wherein the cellular structure is made with aluminum.

A method of manufacturing a power distribution panel comprising: forming a cellular structure with a plurality of voids to define a backplane; covering the cellular structure with at least one insulating panel; and mounting at least one electrical component to the insulating panel.

The method of any preceding clause, further comprising mounting a set of feet directly to the insulating panel to absorb shear stress applied to the insulating panel where the set of feet is located in the same plane as but separate from the backplane.

The method of any preceding clause, further comprising mounting multiple feet to the insulating panel at corresponding multiple corners of the insulating panel.

The method of any preceding clause, further comprising forming the cellular structure into a honeycomb structure.

The method of any preceding clause, further comprising forming the insulating panel with melamine.

The method of any preceding clause, further comprising forming the cellular structure with aluminum.

The method of any preceding clause, further comprising distributing the plurality of voids throughout the backplane in an arrangement of shapes closely fitted together in a repeated pattern without gaps or overlapping.

What is claimed is:

1. A power distribution panel comprising: a backplane comprising at least a portion having a cellular structure defining a plurality of voids;
   at least one insulating panel covering at least some of the plurality of voids;
   at least one electrical component mounted to the insulating panel;
   a set of feet coupled to the insulating panel; wherein the set of feet are decoupled from the backplane; wherein the set of feet are mounted to a structure of a vehicle; wherein the set of feet are configured to absorb shear stress applied to the insulating panel; and
   wherein at least a portion of the set of feet is located in the same plane as the backplane.

2. The power distribution panel of claim 1, wherein the cellular structure is a honeycomb structure.

3. The power distribution panel of claim 1, wherein the insulating panel is made with melamine.

4. The power distribution panel of claim 1, wherein the cellular structure is made with aluminum.

5. The power distribution panel of claim 1, wherein the plurality of voids are distributed throughout the backplane in an arrangement of shapes closely fitted together in a repeated pattern without gaps or overlapping.

6. A power distribution panel comprising: a backplane comprising at least a portion having a cellular structure defining a plurality of voids, at least one insulating panel covering at least some of the plurality of voids; at least one electronic component mounted to the insulating panel;
   a set of feet mounted directly to the insulating panel and configured to absorb shear stress applied to the insulating panel; wherein the set of feet are located in the same plane as the backplane; wherein the set of feet is separate from the backplane;
   wherein the set of feet are mounted to a structure of a vehicle; and
   wherein the backplane is configured to absorb perpendicular stress applied to the backplane.

7. The power distribution panel of claim 6, wherein the plurality of voids is distributed throughout the backplane in an arrangement of shapes closely fitted together in a repeated pattern without gaps or overlapping.

8. The power distribution panel of claim 6, wherein the insulating panel is made with melamine.

9. The power distribution panel of claim 6, wherein the cellular structure is made with aluminum.

10. A method of manufacturing a power distribution panel comprising: forming a cellular structure with a plurality of voids to define a backplane; covering the cellular structure with at least one insulating panel; mounting at least one electrical component to the insulating panels mounting a set of feet directly to the insulating panel to absorb shear stress applied to the insulating panel; and
    wherein the set of feet is located in the same plane as but separate from the backplane, and further comprising mounting the set of feet to a vehicle.

11. The method of claim 10, further comprising mounting multiple feet of the set of feet to the insulating panel at corresponding multiple corners of the insulating panel.

12. The method of claim 10, further comprising forming the cellular structure into a honeycomb structure.

13. The method of claim 10, further comprising forming the insulating panel with melamine.

14. The method of claim 10, further comprising forming the cellular structure with aluminum.

15. The method of claim 10, further comprising distributing the plurality of voids throughout the backplane in an arrangement of shapes closely fitted together in a repeated pattern without gaps or overlapping.

* * * * *